(12) United States Patent
Wilson (10) Patent No.: US 9,461,540 B2
(45) Date of Patent: Oct. 4, 2016

(54) ASYNCHRONOUS SWITCH MODE POWER SUPPLY

(75) Inventor: Martin Wilson, Cambourne (GB)

(73) Assignee: SNAPTRACK, INC., San Diego, CA (US)

( * ) Notice: Subject to any disclaimer, the term of this patent is extended or adjusted under 35 U.S.C. 154(b) by 251 days.

(21) Appl. No.: 14/237,433

(22) PCT Filed: Aug. 9, 2012

(86) PCT No.: PCT/EP2012/065575
§ 371 (c)(1),
(2), (4) Date: Apr. 30, 2014

(87) PCT Pub. No.: WO2013/021028
PCT Pub. Date: Feb. 14, 2013

(65) Prior Publication Data
US 2015/0069985 A1    Mar. 12, 2015

(30) Foreign Application Priority Data

Aug. 9, 2011    (GB) .................................. 1113702.3

(51) Int. Cl.
*H02M 3/158*    (2006.01)
*H03F 3/217*    (2006.01)
(Continued)

(52) U.S. Cl.
CPC ............ *H02M 3/158* (2013.01); *H03F 1/025* (2013.01); *H03F 1/0211* (2013.01); *H03F 1/0227* (2013.01); *H03F 3/217* (2013.01); *H02M 2001/0003* (2013.01); *H03F 2200/102* (2013.01)

(58) Field of Classification Search
CPC ................... H02M 3/56; H02M 3/156–3/158; H02M 3/575; H02M 2001/0003; H02M 3/1588; H02M 2200/102; G05F 1/56; G05F 1/573; G05F 1/575; H03F 3/217; H03F 1/0227; H03F 1/0211
USPC .................................. 323/279–286, 271–275
See application file for complete search history.

(56) References Cited

U.S. PATENT DOCUMENTS

| 6,373,340 B1 | 4/2002 | Shashoua |
| 7,084,613 B2 | 8/2006 | Harris et al. |
| 7,330,069 B2 | 2/2008 | Yamamura et al. |

(Continued)

FOREIGN PATENT DOCUMENTS

| EP | 1947833 A2 | 7/2008 |
| GB | 2463880 A  | 3/2010 |

(Continued)

OTHER PUBLICATIONS

"Related International Patent Application No. PCT/EP2012/065575 International Preliminary Report on Patentability ", "(IPRP)", Apr. 5, 2013, Publisher: PCT.

(Continued)

*Primary Examiner* — Yemane Mehari (57) ABSTRACT

There is disclosed an asynchronous switch mode power supply comprising: a subtractor for subtracting an output of the switch mode power supply from a reference signal; a filter for filtering the subtracted output; a quantizer for generating a plurality of quantizer outputs in dependence on the integrated subtracted output; and a power switch stage for connecting one of a plurality of supply voltages to the output of the switch mode power supply in dependence on the quantizer outputs.

20 Claims, 7 Drawing Sheets

(51) Int. Cl.
  *H03F 1/02*    (2006.01)
  *H02M 1/00*    (2006.01)

(56) References Cited

U.S. PATENT DOCUMENTS

| | | |
|---|---|---|
| 7,457,595 B2 | 11/2008 | Schoofs et al. |
| 2004/0217741 A1 | 11/2004 | Muratov et al. |
| 2006/0197570 A1 | 9/2006 | Yang et al. |
| 2006/0261794 A1* | 11/2006 | May .............. H02M 3/158 323/283 |
| 2007/0200538 A1 | 8/2007 | Tang et al. |
| 2008/0310200 A1 | 12/2008 | Maksimovic et al. |
| 2009/0224731 A1 | 9/2009 | Tang et al. |
| 2010/0117727 A1 | 5/2010 | Dawson et al. |
| 2013/0200865 A1* | 8/2013 | Wimpenny .............. H02M 1/08 323/271 |

FOREIGN PATENT DOCUMENTS

| | | |
|---|---|---|
| JP | 2007-036736 A | 2/2007 |
| WO | 2008154031 | 12/2008 |

OTHER PUBLICATIONS

International Search Report and Written Opinio—PCT/EP2012/065575—ISA/EPO—Apr. 5, 2013.

"Parent GB Patent Application No. GB1113702.3 Search Report", Nov. 23, 2011, Publisher: UK IPO, Published in: GB.

"Related International Patent Application No. PCT/EP2012/065575 International Search Report and Written Opinion", Apr. 5, 2013, Publisher: PCT, Published in: EP.

* cited by examiner

ASYNCHRONOUS SWITCH MODE POWER SUPPLY

BACKGROUND TO THE INVENTION

1. Field of the Invention

The present invention relates to an asynchronous switch mode power supply, and particularly to such an arrangement comprising a closed loop arrangement in which the output is fed back to the input. The invention is particularly but not exclusively concerned with an envelope tracking power supply containing such an asynchronous switch mode power supply.

2. Description of the Related Art

Switch mode power supplies are well-known in the art. It is known in a switch mode power supply to provide a closed control loop, in which the output representing the selected supply voltage is fed back to the input, where it is compared with a reference signal. The control loop then acts to correct any error between the signal at the output and the reference (or target) signal.

In known prior art arrangements, synchronous operation is provided. Such known prior art arrangements provide synchronous control in which the switch mode power supply is typically a multi-level, multi-phase voltage converter. Different phases of a clock signal are used, in particular, to produce a finer phase/amplitude resolution than can be achieved with a single clock phase.

It is an aim of the invention to provide an improved switch mode power supply.

SUMMARY OF THE INVENTION

In accordance with the invention there is provided an asynchronous switch mode power supply comprising: a subtractor for subtracting an output of the switch mode power supply from a reference signal; a filter for filtering the subtracted output; a quantiser for generating a plurality of quantiser outputs in dependence on the integrated subtracted output; and a power switch stage for connecting one of a plurality of supply voltages to the output of the switch mode power supply in dependence on the quantiser outputs.

The quantiser may comprise a plurality of comparators, each comparator being provided with a feedback loop from its output to its input.

The switch mode power supply may further comprise a plurality of combiners for combining the output of each respective comparator with a signal based on the integrated output to provide the input to each of the respective comparators.

The switch mode power supply may further comprise a plurality of reference signals, and further comprising a plurality of further combiners, the plurality of further combiners each being arranged to combine the respective reference signal with the integrated output, to provide the representation of the integrated output signal for the combiner which receives the output of each of the respective comparators and generates the inputs for the respective comparators.

The plurality of reference signals may be generated in dependence on a plurality of supply voltage signals in the output switch stage.

The output switching stage may receive the plurality of quantiser outputs, and in dependence thereon connects one of a plurality of supply voltages to the output of the switch mode power supply.

The plurality of quantiser outputs may be determined by the number of supply voltages in the output switching stage.

The integrator may comprise a loop filter.

An envelope tracking power supply may comprise a switch mode power supply as defined.

The switch mode power supply may further comprise a combiner arranged to combine the integrated output and the input reference signal, the combined output thereof providing the input to the quantiser.

The switch mode power supply may further comprise a delay stage connected to receive the input reference signal, wherein the combiner is arranged to combine the output of the delay stage with the feedback signal representing the output switch mode power supply.

The delay of the delay stage may correspond to the delay of the output switching stage.

The switch mode power supply may 12 further comprise an additional switching stage for receiving the plurality of quantiser outputs, and for connecting one of a plurality of signals representing the supply voltages to the input subtractor. The switching devices of the further switching stage may be smaller than the switching devices of the output stage. The signals may be current signals.

The switch mode power supply may further comprise a feedback path from the output of the output switching stage to the input combiner, wherein the input combiner combines the input reference signal, the feedback signal from the further switching stage, and the feedback signal from the output of the output switching stage.

An envelope tracking power supply may include a switch mode power supply as defined.

The envelope tracking power supply may further comprise an error correction path for generating an error signal to be combined with the output of the switch mode power supply.

The power switch stage may comprise a plurality of switcher stages, each switcher stage being adapted to switch one of the plurality of switch mode power supplies to an output of the switcher stage in dependence on the quantiser outputs, and further comprising a combiner for combining the switcher stage outputs.

The switch mode power supply or envelope tracking power supply of any preceding claim, in which the quantiser is arranged to generate m quantiser outputs, and the power switch stage comprises m switching stages each arranged to connect one of n supply voltages to an output thereof in dependence on the quantiser outputs, and further comprising a combiner for combing the output of each switching stage to generate the switched mode power supply output.

The invention also provides a switched mode power supply comprising: n power supply levels; an m(n−1) level quantiser arranged to provide m(n−1) quantiser outputs; m switching stages each arranged to connect one of n power supplies to a switching stage in dependence on the m(n−1) quantiser outputs; and a combiner for combining the outputs of each switching stage to generate an output supply levels.

The output supply levels may comprise n supply voltage rail levels and a plurality of inter-rail supply levels, a controller being adapted to select the inter-rail levels by connecting at least two switching stages to different ones of said n supply voltage levels.

If a plurality of switch positions of the switching stages provide a given inter-rail supply level, the controller may be adapted to select a switching combination which differs from the switching combination on the previous inter-rail supply voltage selection.

The at least two switching stages may be connected to adjacent supply voltage levels.

The controller may be adapted to determine, for selection of an inter-rail supply level, if a current exceeds a threshold, and in dependence thereon maintain the switcher state.

The combiner may comprise m inductors each having a first terminal connected to the output of a respective one of the m switching stages, and each having a second terminal connected to an output terminal of the switched mode power supply.

In dependence on the current in one inductor exceeding a threshold value the connection of the switching stages to the different supply voltage levels may be changed, to reverse the direction of current.

The invention also provides a method for an asynchronous switch mode power supply comprising: subtracting an output of the switch mode power supply from a reference signal; filtering the subtracted output; generating a plurality of quantiser outputs in dependence on the integrated subtracted output; and connecting one of a plurality of supply voltages to the output of the switch mode power supply in dependence on the quantiser outputs.

The quantiser may comprise a plurality of comparators, each comparator being provided with a feedback loop from its output to its input.

The method may further comprise a plurality of combiners for combining the output of each respective comparator with a signal based on the integrated output to provide the input to each of the respective comparators.

The may further comprise a plurality of reference signals, and further comprising a plurality of further combiners, the plurality of further combiners each combining the respective reference signal with the integrated output, to provide the representation of the integrated output signal for the combiner which receives the output of each of the respective comparators and generates the inputs for the respective comparators.

The method may further comprise generating the plurality of reference signals in dependence on a plurality of supply voltage signals in the output switch stage.

The method may further comprise receiving, at the output switching stage, the plurality of quantiser outputs, and in dependence thereon connecting one of a plurality of supply voltages to the output of the switch mode power supply.

The method may comprise determining the plurality of quantiser outputs by the number of supply voltages in the output switching stage.

The integrator may comprise a loop filter.

A method in an envelope tracking power supply may comprise a method as defined.

The method may further comprise a combiner arranged to combine the integrated output and the input reference signal, the combined output thereof providing the input to the quantiser.

The method may further comprise a delay stage connected to receive the input reference signal, the method comprising combining the output of the delay stage with the feedback signal representing the output switch mode power supply.

The delay of the delay stage may correspond to the delay of the output switching stage.

The method may further comprise an additional switching stage, the method comprising receiving the plurality of quantiser outputs, and connecting one of a plurality of signals representing the supply voltages to the input subtractor.

The switching devices of the further switching stage may be smaller than the switching devices of the output stage.

The signals may be current signals.

The method may further comprise providing a feedback path from the output of the output switching stage to the input combiner, wherein the input combiner combines the input reference signal, the feedback signal from the further switching stage, and the feedback signal from the output of the output switching stage.

A method in an envelope tracking power supply may include a switch mode power supply as defined.

The method may further comprise an error correction path for generating an error signal to be combined with the output of the switch mode power supply.

The method in the switch mode power supply or the envelope tracking power supply, in which the power switch stage may comprise a plurality of switcher stages, each switcher stage switching one of the plurality of switch mode power supplies to an output of the switcher stage in dependence on the quantiser outputs, and further comprising combining the switcher stage outputs.

The quantiser may generate m quantiser outputs, and the power switch stage comprises m switching stages each connecting one of n supply voltages to an output thereof in dependence on the quantiser outputs, and further comprising combining the output of each switching stage to generate the switched mode power supply output.

The invention provides a method of controlling a switched mode power supply comprising: providing n supply voltage levels; arranging an $m(n-1)$ level quantiser to provide $m(n-1)$ quantiser outputs; arranging m switching stages to select one of the n power supplies to a switching stage output in dependence on the $m(n-1)$ quantiser outputs; and combining the outputs of each switching stage to generate an output voltage supply levels.

In general, the number of supply voltages is preferably n; the number of switch stages or output inductors is m; the number of quantiser outputs is $m(n-1)$; the number of possible output voltage levels is $m(n-1)+1$; and the number of inter-rail supply voltage output levels is $(m(n-1)+1)-n$.

The output supply levels may comprise n supply voltage rail levels and inter-rail supply levels, the method comprising selecting the inter-rail levels by connecting at least two switching stages to different ones of said supply voltage levels.

If a plurality of switch positions of the switching stages provide a given inter-rail supply level, the method may comprise selecting a switching combination which differs from the switching combination on the previous inter-rail supply voltage selection.

The at least two switching stages may be connected to adjacent supply voltage levels.

The method may comprise determining, for selection of an inter-rail supply level, if a current exceeds a threshold, and in dependence thereon maintain the switcher state.

The combiner may comprise m inductors each having a first terminal connected to the output of a respective one of the m switching stages, and each having a second terminal connected to an output terminal of the switched mode power supply.

In dependence on the current in one inductor exceeding a threshold value the connection of the switching stages to the different supply voltage levels may be changed, to reverse the direction of current.

BRIEF DESCRIPTION OF THE DRAWINGS

The invention will now be described by way of example to the accompanying Figures, in which.

DESCRIPTION OF THE PREFERRED EMBODIMENTS

The invention is now described by way of reference to particular examples and embodiments. One skilled in the art will appreciate that the invention is not limited to the details of the specific embodiments given herein. In addition, the various embodiments described herein are not mutually exclusive. The embodiments described herein may be implemented individually or in any combination.

Figure 1:
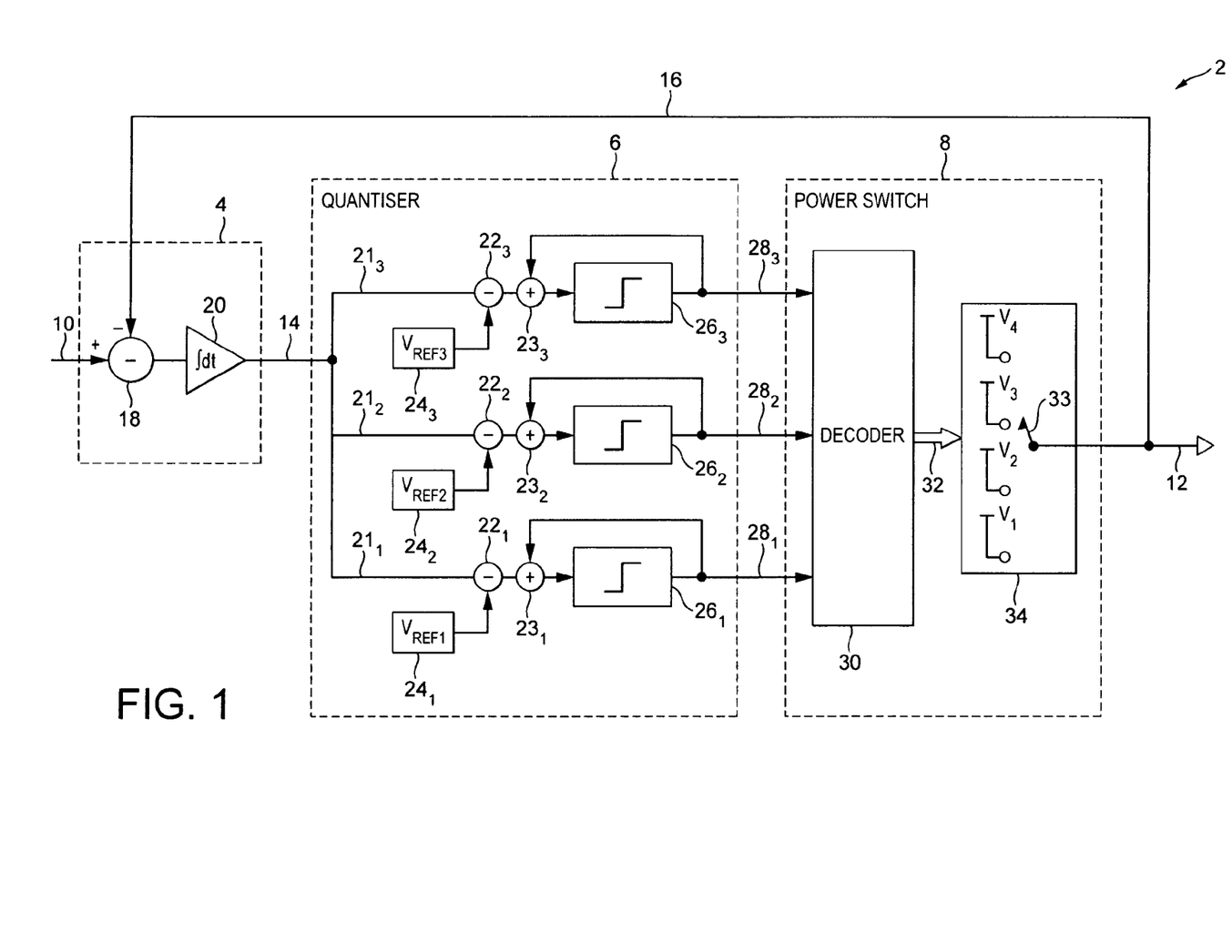
FIG. 1 illustrates the architecture of an asynchronous switch mode power supply in accordance with an embodiment of the invention.

With respect to FIG. 1, there is illustrated an asynchronous switch mode power supply in accordance with a preferred embodiment of the invention, denoted by reference numeral 2. The asynchronous switch mode power supply 2 includes an input stage 4, a quantiser 6, and a power switch 8. A reference signal is received as an input on a signal line 10, and a supply voltage is generated as an output on output line 12.

In the preferred implementation, the input stage comprises a subtractor 18 and an integrator 20. The subtractor 18 receives the reference signal input on line 10, and a feedback of the output signal on line 12 via a feedback line 16. The subtractor 18 subtracts the feedback signal on line 16 from the input reference signal on line 10, and generates at its output an error signal representing the difference therebetween. The output signal on line 12 is intended to be a high power replica of the input reference signal on line 10, and any error signal at the output of the subtractor 18 represents the error in the replica signal in comparison to the input reference signal. The output of the combiner 18 is provided as an input to the integrator 20, which generates an integrated or averaged error signal on line 14.

The quantiser 6 is illustrated in a preferred embodiment, and receives as an input the integrated signal on line 14, and generates as an output three control signals on lines $28_1$ to $28_3$. In general, a switch mode power supply is an n-level power supply, generating an output supply voltage based on one of n possible supply voltages. In the described examples herein, a four-level switch mode power supply is described, i.e. with n equal to 4. For an n-level switch mode power supply, the quantiser is required to generate n−1 output control signals to control switching between n-levels. The quantiser 6 thus generates three output control signals on lines $28_1$ to $28_3$, but in general can be considered to generate n−1 output control signals.

The quantiser 6 effectively comprises three identical circuits, for generating each of the three control signals for the four level switch mode power supply. In more general terms the quantiser would comprise n−1 identical circuits for the n output voltages. In FIG. 1, each element of the three circuits which corresponds to an element of the other circuits is denoted by the same reference numeral, with the suffix 1 to 3. Thus in the following paragraph describing the implementation of the quantiser 6, it will be understood that mention of each reference numeral is in fact a mention of that element in each of the three circuits.

The integrated signal on line 14 is provided at an input to a plurality of subtractors $22_1$ to $22_3$ on respective individual lines $21_1$ to $21_3$. The inputs on lines $21_1$ to $21_3$ are therefore the inputs to each of the three circuits of the quantiser 6.

Each subtractor $22_1$ to $22_3$ receives as a second input an input from a respective reference voltage source, $V_{REF1}$ to $V_{REF3}$ denoted by reference numeral $24_1$ to $24_3$. The reference voltages $V_{REF1}$ to $V_{REF3}$ are derived from a set of output voltages ($V_1$ to $V_3$) which are provided as supply voltages to the power switch 8. The reference voltages are provided in ascending order, the voltage $V_{REF1}$ being the lowest voltage, and the reference voltage $V_{REF3}$ being the highest reference voltage.

The reference voltages are set to provide the transition point for each quantiser stage, as known in the art. For example, the four supply voltages $V_1$, $V_2$, $V_3$ and $V_4$ may correspond to voltage levels 0V, 1V, 2V, 3V. The reference voltage $V_{REF1}$, for example, is set somewhere between 0V and 1V, so as the input signal transitions from 0V to 1V the output on line 28, changes from state 0 to state 1. In an example, $V_{REF1}$=0.5V; $V_{REF2}$=1.5V; and $V_{REF3}$=2.5V.

Each of the subtractors $22_1$ to $22_3$ subtracts the associated reference voltage from the common integrated error signal on line 14.

The output of each subtractor $22_1$ to $22_3$ is provided as a first input to respective summers $23_1$ to $23_3$. The output of the respective summers $23_1$ to $23_3$ are provided as respective inputs to respective comparators $26_1$ to $26_3$. The outputs of the comparators $26_1$ to $26_3$ are fed back and provided as the second inputs to the respective summers $23_1$ to $23_3$. The outputs of the respective comparators $26_1$ to $26_3$ additionally form the output control signals on lines $28_1$ to $28_3$ of the quantiser 6.

The feedback loop around the comparators $26_1$ to $26_3$ provides hysteresis around the comparators. The comparators $26_1$ to $26_3$ have to have a hysteresis in order to have clearly defined switch states.

With further reference to FIG. 1, the outputs on signal lines $28_1$ to $28_3$ from the quantiser 6 provide the inputs to the power switch 8.

The power switch 8 includes a decoder 30 and a switching stage 34. The decoder 30 receives the control signals on lines $28_1$ to $28_3$, and as known in the art decodes such signals to provide control signals on lines 32 to the switching stage 34. The switching stage 34 includes a switch 33 connected to the output line 12, which switches to connect one of the supply voltages $V_1$ to $V_3$ to the output line 12 in dependence on the control signals on line 32, again as known in the art. The switches of the switching stage 34 are, in practice, implemented as transistors, as well-known in the art. The switches of the switching stage 34 are power switches, for switching supply voltages, and therefore are physically large devices.

The selected supply voltage on line 12 is provided on the feedback path on line 16 to the input stage 4, as an input to the subtractor 18.

The integrator 20 is an example implementation of a loop filter for the closed loop arrangement of FIG. 1. The integrator 20 also provides a summing effect, to provide a delta topology for the switch mode power supply of FIG. 1. The loop filter acts as a ramp generator. Thus the loop filter 20 in combination with the comparators $26_1$ to $26_3$ with feedback providing hysteresis, provides a self-clocking arrangement.

The hysteresis provided by the feedback around the comparators $26_1$ to $26_3$ in combination with the loop filter 20 and the input waveform itself on line 10 defines the bandwidth and switching rate of the switch mode power supply 2.

Overall, the quantiser 6 converts an analogue signal provided on the input line 14 into a series of digital signals on lines $28_1$ to $28_3$, each of which is set high if the input signal exceeds a threshold (or transition point), on a thermometer scale.

The hysteresis feedback around the comparators $26_1$ to $26_3$ provides an oscillatory condition which acts as the internal clock. The integrator 20 in the overall feedback loop provides the ramps for the quantiser.

The provision of the closed loop feedback, from the output 12 to the input stage 4 via the feedback line 16, provides the sigma topology of the switch mode power supply 2 of FIG. 1.

As both a sigma topology and a delta topology are provided in the switch mode power supply of FIG. 1, FIG. 1 is an implementation of an asynchronous delta-sigma controller for a switch mode power supply.

The arrangement of FIG. 1 for asynchronous operation uses, in the quantiser, certain technology and certain functionality which is known from synchronous operation, suitably further adapted. However no external clock signals are provided, and thus the arrangement is asynchronous. The asynchronous operation is enabled by the provision of the feedback connections around the comparators $26_1$ to $26_3$, and the provision of the loop filter, exemplarily implemented as integrator 20.

Thus the arrangement of FIG. 1 shows a complete delta-sigma power modulator loop for an asynchronous switch mode power supply. The integrator 20 together with the hysteresis range of the feedback around the comparators $26_1$ to $26_3$ and the loop delay provided by the feedback on line 16 set the loop bandwidth.

The asynchronous switch mode power supply of FIG. 1 can be further improved in additional embodiments. The additional embodiments which are now described, are not limited to the specific implementation of the asynchronous switch mode power supply of FIG. 1. The following improvements may be implemented in any asynchronous switch mode power supply, and are not limited to being implemented in combination with the detailed arrangement of FIG. 1. However, they can be advantageously implemented in combination with the implementation of an asynchronous switch mode power supply as illustrated in FIG. 1. In the Figures where like reference numerals are used, the elements denoted in each Figure denote corresponding elements.

Figure 2:
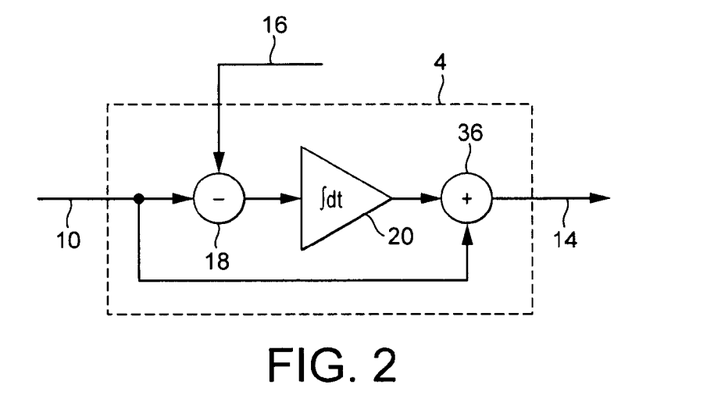
FIG. 2 illustrates a further modification to the asynchronous switch mode power supply of the invention as illustrated in FIG. 1.

With reference to FIG. 2, an improvement to the input stage 4 of the switch mode power supply 2 of FIG. 1 is illustrated. As illustrated in FIG. 2, an additional combining stage 36 is included in the input stage 4. The output of the integrator 20 provides a first input to the combining stage 36. The reference input signal on line 10 provides a second input to the combining stage 36. The output of the combining stage 36 provides the signal on line 14 at the input to the quantiser 6. Otherwise the input stage 4 of FIG. 1 is unmodified.

The improvement of FIG. 2 provides for improved accurate tracking at high bandwidths. The input reference signal is fed forward directly to the quantiser input. For high frequencies, the quantiser 6 behaves as if it is an open loop quantiser, with no feedback. At low frequencies, the feedback on line 16 provides for closed loop operation. Thus in low frequency operation the delta-sigma function operates, allowing interpolation between quantisation levels, by combining the input reference signal with the fed back output signal. Thus an improvement is obtained by feeding forward the reference signal directly to the input of the quantiser.

Figure 3:
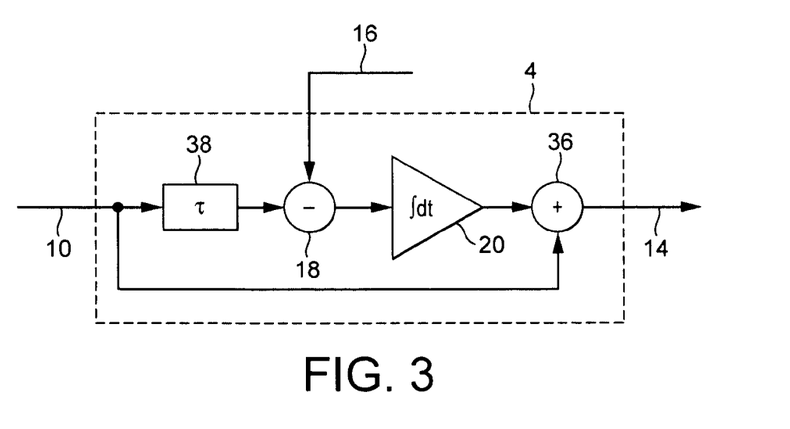
FIG. 3 illustrates a further modification to the switch mode power supply in accordance with the invention as illustrated in FIG. 1.

A further modification to the switch mode power supply of FIG. 1 is illustrated in FIG. 3. Again, the improvement relates to the input stage 4. As shown in FIG. 3, the input stage 4 is further modified in comparison to the arrangement of FIG. 2, to include a delay block 38. It should be understood that although the improvement of FIG. 3 is shown in combination with the improvement of FIG. 2, the improvement of FIG. 3 may be obtained without implementing the improvement associated with FIG. 2.

With further reference to FIG. 3, the delay block 38 is provided at the input of the subtractor 18, such that the reference input signal on line 10 is delayed by the delay block 38 before being provided to the input of the subtractor 18. Otherwise the input stage 4 is unmodified in comparison to the input stage 4 of FIG. 2. The implementation of the delay stage 30 benefits the tracking accuracy of the switch mode power supply. The delay of delay stage 38 is preferably calculated to be equal to the delay introduced by the switching stages 8. This results in the input reference signal applied to the input of the subtractor 18 being time-aligned with the feedback signal on line 16, so as to provide an improved error signal at the output of the subtractor 18.

Figure 4:
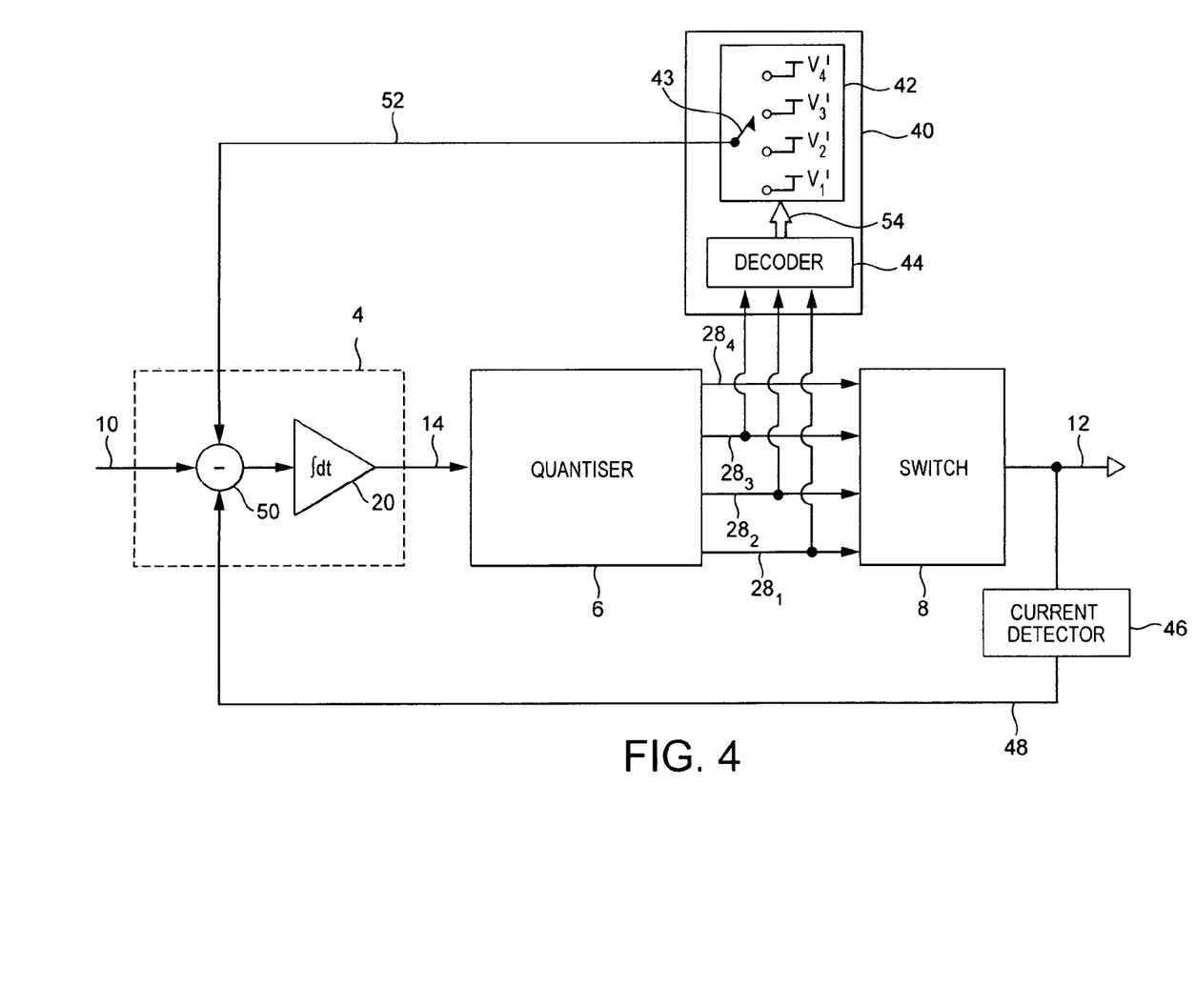
FIG. 4 illustrates a still further modification to the switch mode power supply in accordance with the invention as illustrated in FIG. 1.

With reference to FIG. 4, there is illustrated a still further preferred improvement to the asynchronous switch mode power supply of FIG. 1. In the arrangement of FIG. 4, the input stage 4 is implemented in accordance with the arrangement as illustrated in FIG. 1. It will be understood, however, that the input stage 4 may be implemented in accordance with either of the improvement shown in FIG. 2 or FIG. 3, and in accordance with the improvement of FIG. 3 without the improvement of FIG. 2.

The power switch 8 adds a substantial delay to the feedback system due to the size of the devices. The arrangement of FIG. 4 overcomes the disadvantage of this delay. This is achieved by taking the output signal for providing the feedback to the input stage 4 from the input of the power switch stage 8, or the output of the quantiser 6, rather than the output of the power switch stage 8, and thus avoiding the delay of the power switch.

With reference to FIG. 4, in this embodiment an additional switching stage 40 is provided, including an associated decoder 44 and a switcher 42. The decoder 44 receives as inputs the outputs on lines $28_1$ to $28_4$ of the quantiser 6. In an alternative arrangement, the decoder 44 may not be provided, and the switching stage 42 may receive the control signals from the output of the decoder 30 on lines 32. The output of the switching stage 42 is provided on a line 52 to a subtractor 50, which replaces the subtractor 18 of the input stage 4 of FIG. 1. The subtractor 50 replaces the subtractor 18 in order to provide for an additional set of inputs in a further exemplary modification. The subtractor 50 of the input stage 4 of FIG. 4 optionally receives a third set of inputs, as will be described further hereinbelow, in addition to the input reference signal on line 10 and the feedback signal on line 52 from the switching stage 42.

The outputs of the quantiser 6, on lines $28_1$ to $28_3$ (or the decoder 30 output on lines 32) simultaneously operate both the switching stage 34 of the output power switch 8, and the switching stage 42, which can be considered as comprising a local low power switch.

In a preferred embodiment, the switch stage 42 comprises a set of current switches 43, which switches switch current, derived from the input voltages to the main switches as denoted by voltage sources V1' to V4'. The output of the local switches 43 of the switching stage 42 then becomes a replica of the output of the respective main switch 33 of the power switch 8. The switching stage 42 is a low power and small scale replica of the switching stage 34.

Thus the switching stage 42 includes a plurality of switches, denoted in general by switch 43, corresponding to the plurality of switches of the switching stage 8, denoted in general by switch 33. However since the switching stage 42 can be implemented with substantially smaller physical devices than the power switching stage 8, the delay caused by the switching stage 42 is substantially reduced compared to the delay caused by the power switch 8. Thus by providing the feedback loop from the input of the switching stage 8 (or the output of the quantiser 6) rather than the output of the switching stage 8, the delay of the control loop is significantly reduced whilst still providing the desirable feedback information.

A further optional improvement can be included in the arrangement of FIG. 4, comprising a current detector 46 and an additional feedback loop provided by feedback line 48 to the subtractor 50. As shown in FIG. 4, the current detector 46 is connected to receive the signal on the output line 12, and the feedback path 48 connects the output of the current detector to the optional third input of the subtractor 50. Thus the feedback provided by the current detector 46 is subtracted from the input reference signal on line 10, together with the subtraction of feedback 52 from the switching stage 42.

The current detector 46 and feedback path 48 provide a second feedback loop around the switch mode power supply. This corrects for any error introduced by the current flowing through the switching devices of the power switch 8.

The correction loop measurement provided by the current detector 46 may in fact be any parameter derived from the output of the power switch stage 8, and can be used for example to remove offset currents in a correction amplifier which receives an input from signal line 12.

In a still further modification, the quantiser 6 can be modified, in any embodiment, in order to make the reference signals $24_1$ to $24_3$ dynamic, to track the changes in the switcher input levels in the power switch stage 8, so that rather than the quantisation levels being fixed they will track the changes in the associated supplies. The changes in the supplies may be a result, for example, of a poorly regulated supply.

In addition, the various embodiments described hereinabove may be further modified by replacing the integrator 20 with a single pole loop filter. Such a single pole loop filter would still provide the summing, or sigma, operation of the integrator 20. As noted above the integrator is a replica of such a filter.

In synchronous pulse width modulation (PWM) controllers the resolution of the system can be increased by using a multi-phase switcher. Different phases of a clock signal can be used such that the resolution is increased. For example in a dual-phase system the resolution can be doubled. This allows the range of voltages which the output voltages may be selected from to be doubled.

In an asynchronous system as a clock signal is not present, it is not possible to use different phases of the clock signal in order to increase resolution. In an embodiment further in accordance with the invention there is provided a technique for increasing the resolution of an asynchronous system, such that the effective resolution gain achieved by the user of a multi-phase clock in a synchronous system is emulated in an asynchronous system.

In order to achieve this greater resolution, in this embodiment the number of levels in the quantiser 6 of FIG. 1 are increased. In this way the resolution of the system can be increased, the number of levels corresponding—in effect— to an increased number of phases in a synchronous system.

In general, in accordance with the described embodiment, increasing the number of quantiser levels n by a factor m, provides an increased number mn+1 of output voltages from n+1 supply voltages. In embodiments this is achieved by providing m switcher stages each switching between n+1 supply voltages. For the purpose of an illustrative example, n=3 and m=2.

Figure 5:
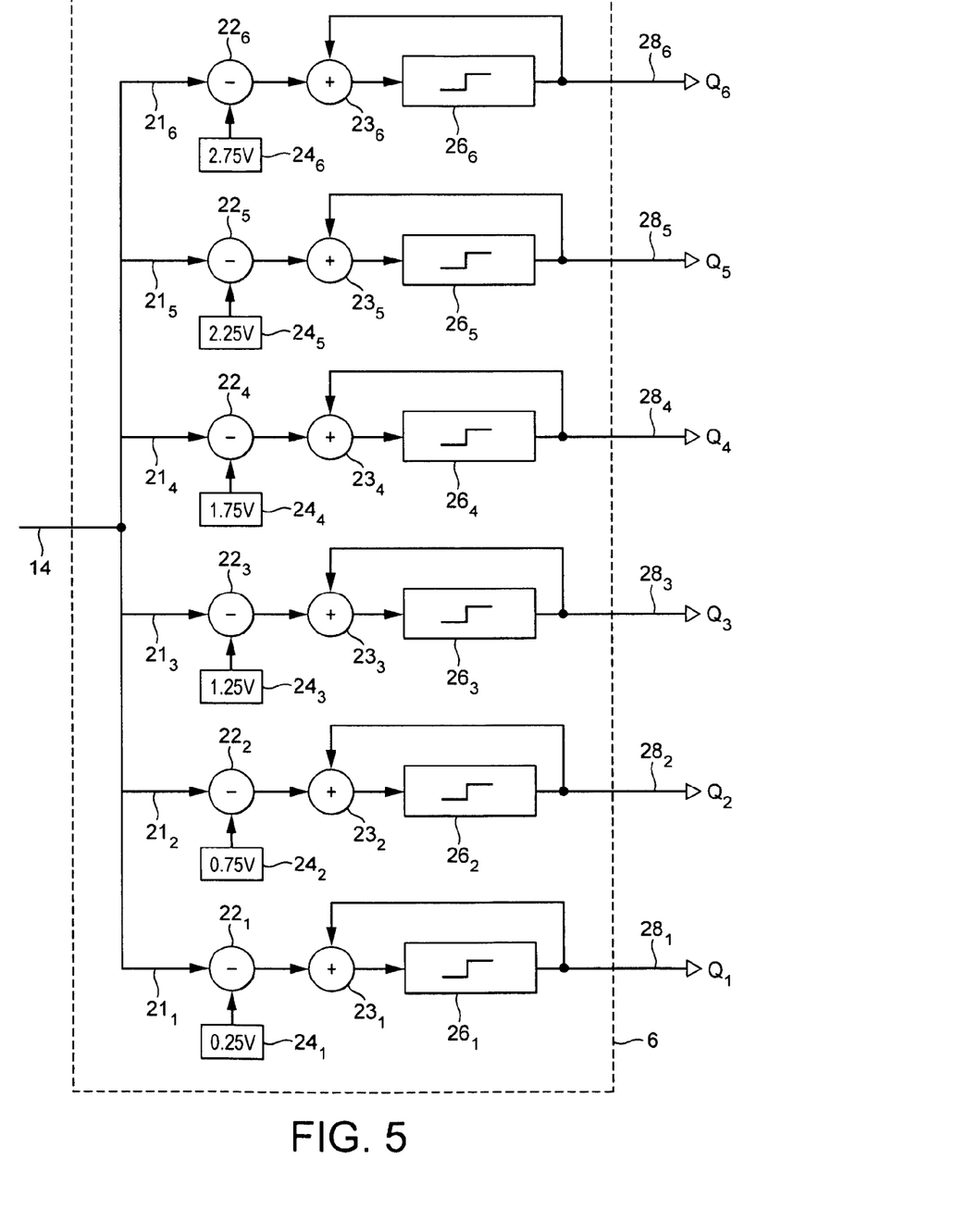
FIG. 5 illustrates an improvement in the asynchronous switched mode power supply according to an embodiment of the invention.

With reference to FIG. 5, there is illustrated a modification to the quantiser 6 of FIG. 1 adapted in order to provide an increased number of quantiser output levels in accordance with this arrangement. In the specific example described, the number of quantiser levels is doubled to six in comparison to FIG. 1, and thus six quantiser outputs are generated on lines $28_1$ to $28_6$, denoted $Q_1$ to $Q_6$.

As discussed above with reference to FIG. 1, the quantiser 6 of FIG. 5 comprises a plurality, in the described example six, of identical quantiser circuits. Each receives a common input signal from the integrator or loop filter on line 14, and generates one of the respective plurality of quantiser output signals.

As with the arrangement of FIG. 1, each quantiser level of FIG. 5 is provided with a respective reference voltage, which may be denoted $V_{REF1}$ to $V_{REF6}$. Whilst the number of quantiser levels has increased (doubled) in comparison to the arrangement of FIG. 1, the number of supply voltages remains the same. Thus whereas in FIG. 1 each quantiser provides a transition point which lies between two distinct supply voltages, in the arrangement of FIG. 5 each pair of quantisers each have a transition point which lies between two adjacent supply voltages. These transition points dictate the reference voltages for each quantiser level in a pair of quantiser levels.

Thus the reference voltages and transition levels for $V_{REF1}$ and $V_{REF2}$ must lie between 0 and 1 volts; the reference voltages for $V_{REF3}$ and $V_{REF4}$ must lie between 1 and 2 volts, and the reference voltages for $V_{REF5}$ and $V_{REF6}$ must lie between the voltage levels 2 volts and 3 volts.

In addition, within each pair of quantiser levels, the transition levels must be set differently so that the point at which a quantiser output transitions from one state to another state is different, otherwise the provision of the additional quantisers would have no effect.

In accordance with a preferred embodiment, the reference voltages for each quantiser level are set as follows:

$V_{REF1}$=0.25V
$V_{REF2}$=0.75V
$V_{REF3}$=1.25V
$V_{REF4}$=1.75V
$V_{REF5}$=2.25V
$V_{REF6}$=2.75V

Thus it can be seen from the above that for each pair of quantiser levels there is a transition through to transition points to transition from one voltage level to an adjacent voltage level, in response to an increasing or decreasing input signal.

In order to double the resolution of the system, each quantiser stage has been doubled or duplicated whilst maintaining the same number of supply voltages.

One skilled in the art will appreciate that the principles of the embodiment as described with reference to FIG. 5 may be extended further. It will be understood that each quantiser level of FIG. 1 has been replaced by two quantiser levels in FIG. 5. This may be extended such that each quantiser level of FIG. 1 is replaced by three or more quantiser levels in an alternative arrangement. Where three quantiser levels are substituted for one quantiser level of FIG. 1, for example, then the reference voltages for each quantiser level within the set of three are set appropriately, such that the transition level for each quantiser is different. For example, the quantiser transition levels may be set such that the reference voltages for the bottom set of three quantiser levels associated with the transition between the supply voltage levels 0 volts and 1 volts are 0.25V, 0.5V and 0.75V.

Table 1 illustrates the quantiser outputs Q1 to Q6 from the quantiser 6 of FIG. 5, illustrating the state output levels of each quantiser output, and the intended output voltage of the output switching stage for each set of quantiser outputs in the described example.

TABLE 1

| Q1 | Q2 | Q3 | Q4 | Q5 | Q6 | Output Voltage |
|---|---|---|---|---|---|---|
| 0 | 0 | 0 | 0 | 0 | 0 | 0 V |
| 1 | 0 | 0 | 0 | 0 | 0 | 0.5 V |
| 1 | 1 | 0 | 0 | 0 | 0 | 1 V |
| 1 | 1 | 1 | 0 | 0 | 0 | 1.5 V |
| 1 | 1 | 1 | 1 | 0 | 0 | 2 V |
| 1 | 1 | 1 | 1 | 1 | 0 | 2.5 V |
| 1 | 1 | 1 | 1 | 1 | 1 | 3 V |

In the described example with the quantiser 6 of FIG. 1, an output switching stage is controlled to allow an output to switch between the voltage levels V1 to V4, which for the purposes of example can be considered to be the voltage levels 0V, 1V, 2V and 3V.

Figure 6:
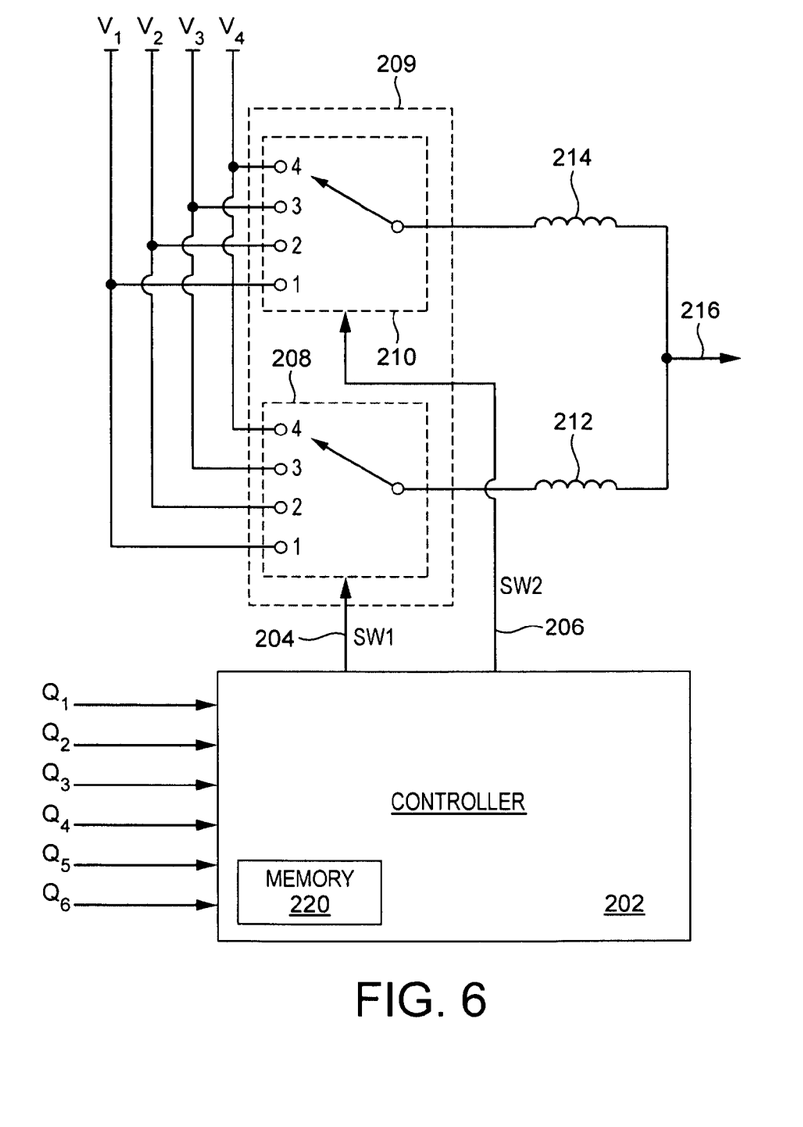
FIG. 6 illustrates an improved output stage of the asynchronous switched mode power supply according to an embodiment of the invention, for use in combination with the arrangement of FIG. 5.

An output stage controller, and an output switching stage, in accordance with a preferred embodiment of the invention for operating under the control of the quantiser of FIG. 5 is illustrated in FIG. 6.

As illustrated in FIG. 6, a controller 202 receives the quantiser output signals $Q_1$ to $Q_6$ as inputs. The controller 202 generates switch control signal SW1 and SW2 on signal lines 204 and 206 respectively. The switch control signals control respective switches 208 and 210 of an output switching stage 209. Each switch 208 and 210 is controlled to switch one of the four supply voltages $V_1$ to $V_4$ (corresponding for example to voltage levels 0V to 3V) to a first terminal of a respective inductor 212 and 214. The second terminals of the respective inductors 212 and 214 are combined on an output line 216, on which an output voltage is developed.

In the output stage of the power switch 8 in accordance with the described embodiment, the same number of supply voltages is present as in the arrangement of FIG. 1, but two power switch stages with half size geometries are introduced to replace the single switch stage of FIG. 1. Each two quantiser states (from the previous one quantiser state) then maps to the two states per level of the two switches. This allows the output voltage to be switched between the voltage levels 0V, 0.5V, 1V, 1.5V, 2V, 2.5V and 3V.

With reference to Table 2, there is illustrated the output voltage generated by the output switcher stage for each set of switch positions.

TABLE 2

| SW1 Position | SW2 Position | Output Voltage |
|---|---|---|
| 1 | 1 | 0 V |
| 1 | 2 | 0.5 V |
| 2 | 1 | 0.5 V |
| 2 | 2 | 1 V |
| 3 | 2 | 1.5 V |
| 2 | 3 | 1.5 V |
| 3 | 3 | 2 V |
| 4 | 3 | 2.5 V |
| 3 | 4 | 2.5 V |
| 4 | 4 | 3 V |

As can be seen in Table 2, when the output voltage corresponds to a rail voltage (i.e. 0 V, 1 V, 2 V, or 3 V), the respective switches are both switched to connect to that rail voltage, and thus are always in the same state. When the output voltage corresponds to a mid-rail voltage (i.e. 0.5 V, 1.5V, or 2.5V), the respective switches may be switched into one of two possible combinations, with one switch being connected to the lower rail voltage of the pair of rail voltages, and the other switch being connected to the higher rail voltage of the pair of rail voltages.

In general, this adaptation in accordance with the aspect of the invention converts an n level quantiser into a mn level quantiser. In the example described, m=2. The quantiser thus generates mn outputs in order to control m output switching stages to allow mn+1 output voltages to be generated from n+1 supply voltages. Thus the resolution of the output voltage is increased without increasing the number of supply voltages.

It will be understood from the above that this may be further expanded to further increase the resolution. In the described example two output switching stages are provided, but the invention may be extended to three or more output switching stages. Thus in the additional example mentioned above, where each single quantiser level of FIG. 1 is replaced with three quantiser levels, three output switching stages are provided in order to allow the output voltage to be switched, in the example where four supply voltages are provided, to generate one of ten possible output voltages.

Moving up two quantization levels means that the two switches change state at exactly the same time.

Moving up one quantization level requires changing of the state of one switcher.

The quantiser outputs Q1 to Q6 are provided as inputs to the controller 202, which generates the switch control signals SW1 and SW2 on lines 204 and 206. Table 3 illustrates the mapping of the state of the quantiser outputs to the states of the switches in the controller 202, effectively combining Tables 1 and Table 2.

TABLE 3

| Q1 | Q2 | Q3 | Q4 | Q5 | Q6 | Switch Positions | Output Voltage |
|---|---|---|---|---|---|---|---|
| 0 | 0 | 0 | 0 | 0 | 0 | SW1 = 0<br>SW2 = 0 | 0 V |

TABLE 3-continued

| Q1 | Q2 | Q3 | Q4 | Q5 | Q6 | Switch Positions | Output Voltage |
|----|----|----|----|----|----|------------------|----------------|
| 1 | 0 | 0 | 0 | 0 | 0 | SW1 = 0<br>SW2 = 1<br>OR<br>SW1 = 1<br>SW2 = 0 | 0.5 V |
| 1 | 1 | 0 | 0 | 0 | 0 | SW1 = 1<br>SW2 = 1 | 1 V |
| 1 | 1 | 1 | 0 | 0 | 0 | SW1 = 1<br>SW2 = 2<br>OR<br>SW1 = 2<br>SW2 = 1 | 1.5 V |
| 1 | 1 | 1 | 1 | 0 | 0 | SW1 = 2<br>SW2 = 2 | 2 V |
| 1 | 1 | 1 | 1 | 1 | 0 | SW1 = 2<br>SW2 = 3<br>OR<br>SW1 = 3<br>SW2 = 2 | 2.5 V |
| 1 | 1 | 1 | 1 | 1 | 1 | SW1 = 3<br>SW2 = 3 | 3 V |

As can be seen from Table 3, two combinations of switcher states can be used to generate certain output voltages, specifically for 0.5V, 1.5V and 2.5V. This can be used, in a preferred arrangement, to balance the currents in the inductors 212 and 214, to overcome a potential problem.

When the switches 208 and 210 are configured with one switch connected to a higher voltage and one connected to a lower voltage of a pair of adjacent rail levels, an output voltage at the junction of the inductors 212 and 214 results that is half-way between the two voltages. Indeed this is the condition that is required in order to generate the mid-rail voltages on the output line 216. However, if this condition is maintained continuously, the current between the voltage levels not contributing to the output would increase until it is limited by the switch transistor resistance and inductor resistance.

In order to avoid this problem, the controller 202 may be configured to alternate the switches between the two combinations of states that result in the same output voltage. As a result of this control, the difference current between the inductors oscillates in a trapezoidal manner rather than continuously increasing, thus avoiding the problem.

Thus in a preferred embodiment the controller is adapted such that if the quantiser outputs dictate an output voltage that requires the switches to be connected respectively to higher and lower voltages of an adjacent pair of rail voltages for a time period greater than some predetermined threshold time period, on determination that the time period has reached the threshold the switch states are inverted by the controller. For example, if SW1=1 and SW2=2, and the threshold time limit is reached, the switches are changed such that SW1=2 and SW2=1.

In a preferred arrangement, when a high bandwidth signal is output, the switcher outputs are made to alternate every time a switching condition to a half-rail voltage occurs. In other words, when the controller determines that a half-rail output voltage is to be set, such that one switch is to be set to a higher voltage and the other to an adjacent lower voltage, the controller determines which switch, in the previous time a half-rail voltage was connected, was connected to the higher voltage, and on this occasion connects it to the lower voltage, or vice versa.

This can be understood by an example. Suppose the output voltage sequences through the voltages 1V, 1.5V, 2V, 2.5V. On the condition for 1 V being detected, the controller sets SW1=1 and SW2=1. On the condition for 1.5V being determined, the controller decides to set SW1=1 and SW2=2. On the condition for 2V being determined, the controller sets SW1=2 and SW2=2. On the condition for 2.5V being determined, the controller verifies what switch conditions were set the last time a mid-rail voltage condition was determined. In this case, that was when 1.5V was detected, and the switches were set SW1=1 and SW2=2. In dependence on that verification, the controller reverses the connection of the switches to the high/low voltages, and sets SW 1=3 and SW2=2, and not SW 1=2 and SW2=3. As such, the switcher trajectory loops between alternate switcher states.

Thus the controller 202 is preferably adapted to include a memory 220 for storing the previous state of the switches in a current mid-rail condition, for use in determining the state of the switches in a next mid-rail condition.

As described above, the relative polarity of the switching stages 208 and 210 is thus flipped at every intermediate output voltage in comparison to the polarity at the previous intermediate output voltage, and as a consequence the polarity of the difference voltage between the two switches is flipped at every intermediate voltage output. This has a significant advantage in that inductor current balancing is achieved without any extra switch transitions above that required if such flipping was not implemented.

Thus the general objective discussed above of ensuring that the switches do not retain a state where one is connected high and the other connected low for a significant time, can be resolved by flipping the connections each time a mid-rail voltage switch condition is entered.

A further problem may arise. This problem can be understood by an example. When a data signal is processed, the length of time in any intermediate state is indeterminate, which may result in a 'random walk' of the inductor out-of-balance current.

In order to bound this current an extra correction loop may be provided. This correction loop has a comparator, so that once the out of balance current exceeds a threshold, the switcher state toggling described above is preferably disabled and one of the switcher states is forced to be permanently higher than the other. Preferably if the current flowing from switcher SW1 to switcher SW2 is excessive switcher SW1 is barred from going above switcher SW2 until the current drops below the threshold. The result of this is a new current trajectory which reduces the current.

Figure 7:
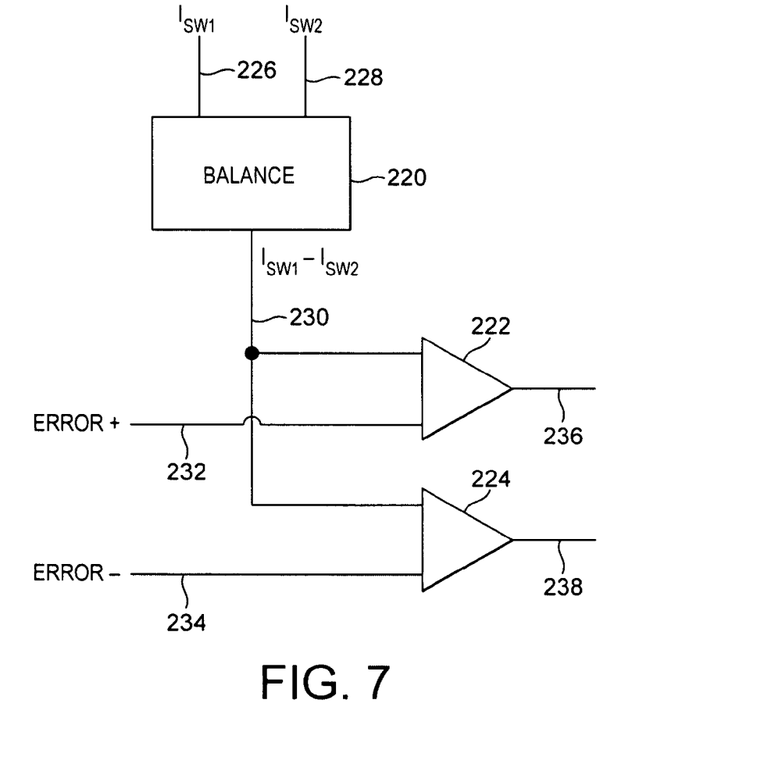
FIG. 7 illustrates a controller for use with the output stage of FIG. 6 in an embodiment.

FIG. 7 illustrates an example implementation of the controller 202 incorporating such a modification. The controller 202 includes a balance detector 220 for detecting the current flowing in each of the inductors 212 and 214, and comparing such. The balance detector 220 receives on an input line 226 a signal representing the output current of switching stage 208, denoted Isw1; and on an input line 228 a signal representing the output current of switching stage 210, denoted Isw2. The currents Isw1 and Isw2 are the currents in the respective inductors 212 and 214. The balance detector is an analogue subtractor function that has an output of (Isw1-Isw2) on an output signal line 230.

A pair of comparators 222 and 224 each receive as one input the output of the balance detector 220 on line 230. The respective comparators 222 and 224 each receive as respective additional inputs a positive trip level reference or threshold signal ERROR+ and a negative trip level reference or threshold signal ERROR− on lines 232 and 2345. The trip level reference signals are labelled as error signals, as they denote an error condition in either a positive or negative direction, representing thresholds in the respective directions above which an error is determined to have occurred.

If neither of the comparator outputs on lines 236 and 238 are set high, the controller 202 operates as normal, and the flipping operation described hereinabove is preferably implemented.

If the output of the comparator 222 on line 236 is set high, the switch 210 is forced to be connected to the higher of the voltage pair, and if the comparator 224 on line 238 is set high, the switch 208 is forced to be connected to the higher of the voltage pair. If either of the comparators 222 and 224 is set high by the circuit of FIG. 7, the relevant condition is maintained until the current is brought back within range (which is detected by the comparator output resetting), and normal operation is resumed.

Thus when the current exceeds the trip level reference signal ERROR+ in the positive direction the switches are forced to increase the current in the negative direction, and when the current exceeds the trip level reference signal ERROR− in the negative direction the switches are forced to increase the current in the positive direction. When neither of the excess conditions are detected, the switcher states are permitted to toggle in accordance with the preferred embodiments as discussed above.

An alternative to a balance block such as in FIG. 7 that measures current directly in the inductors is a "virtual balance block" that receives the digital switcher control signals sw1 and sw2 on signal lines 204 and 206, subtracts them, and then integrates them. This output can then be used to drive the comparators 222 and 224 rather than the output of the balance block 220. This would be simpler to implement than a balance block arrangement such as FIG. 7, but not quite as accurate.

Figure 8:
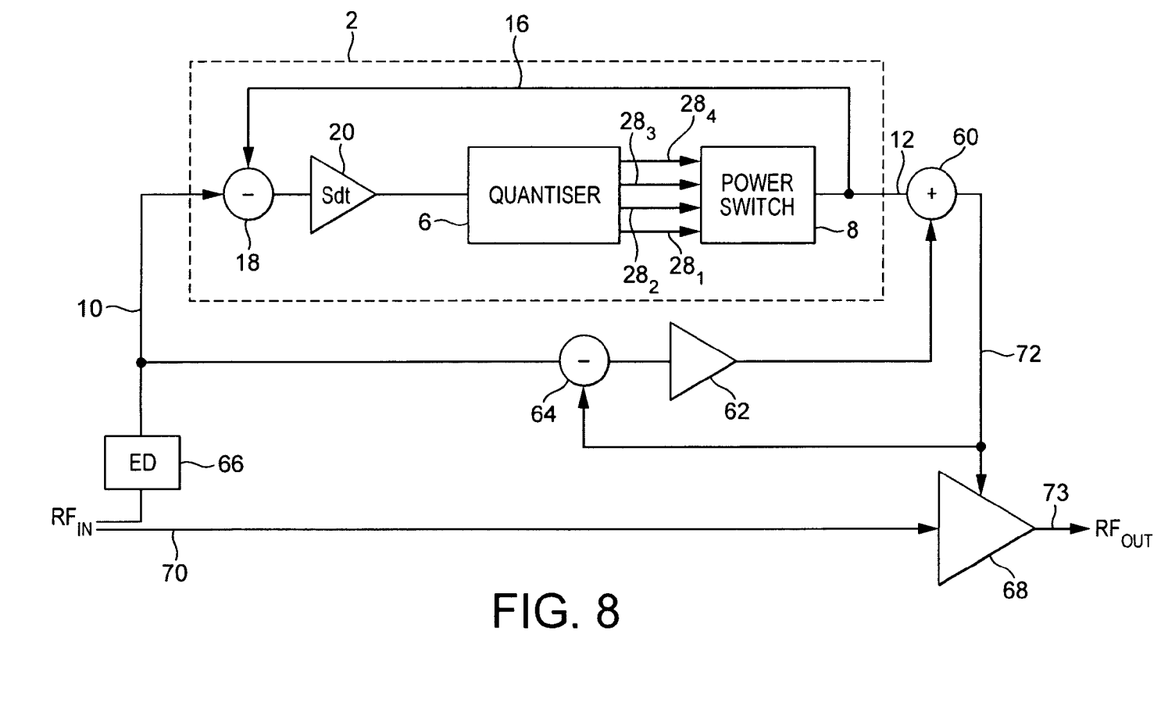
FIG. 8 illustrates the implementation of an envelope tracking power supply for a power amplifier utilising an asynchronous switch mode power supply in accordance with embodiments of the invention.

With reference to FIG. 8, there is now described an example implementation of the asynchronous switch mode power supply as described herein. In the example implementation, the asynchronous switch mode power supply is utilised in an envelope tracking power supply for an RF power amplifier.

With reference to FIG. 8, the asynchronous switch mode power supply 2 of FIG. 1 is illustrated. The asynchronous switch mode power supply may be implemented in accordance with any of the embodiments described hereinabove, either in combination or alone.

Reference numeral 68 denotes an RF amplifier, which receives on a line 70 an RF input signal to be amplified, and generates on a line 73 an amplified RF output signal. An envelope detector 66 receives the RF input signal on line 70, and generates the reference signal on line 10 which comprises a replica of the envelope of the RF input signal. The reference signal on line 10 is additionally provided as a first input to a subtractor 64, which provides an output to an error correction amplifier 62. The output of the error correction amplifier 62 forms a first input to a combiner 60. The second input of the combiner 60 is provided by the output signal on line 12 from the asynchronous switch mode power supply 2. The output of the combiner 60 on line 72 provides a supply voltage for the RF amplifier 68, and is connected to the supply terminal thereof. In addition the output of the combiner 60 on line 72 provides a second input to the subtractor 64. The subtractor 64 thus subtracts the output signal on line 72 from the reference signal on line 10, to provide an input to the error amplifier indicative of the error between the output signal and the input reference. This is combined with the output of the switch mode power supply on line 2, to correct errors therein. The error amplifier 62 acts as a fast or high frequency error correction path, in parallel with the relatively slow or low frequency switch mode power supply 2, to provide an improved envelope tracked power supply signal on line 72 which improves the overall efficiency of a power amplification stage for an RF amplifier.

The invention has been described herein by way of reference to various examples and non-limiting embodiments. One skilled in the art would appreciate that further modifications may be made to the described examples, and the described examples may be combined in various ways, without departing from the scope of the invention as defined by the appended claims.

The invention claimed is:

1. An asynchronous switch mode power supply comprising:
   a subtractor for subtracting an output of the switch mode power supply from a reference signal;
   a filter for filtering the subtracted output;
   a quantizer for generating a plurality of quantizer outputs in dependence on the filtered subtracted output; and
   a power switch stage for connecting one of a plurality of supply voltages to the output of the switch mode power supply in dependence on the quantizer outputs.

2. The switch mode power supply of claim 1, in which the quantizer comprises a plurality of comparators, each comparator being provided with a feedback loop from its output to its input.

3. The switch mode power supply of claim 2, further comprising a plurality of combiners for combining the output of each respective comparator with a signal based on the filtered output to provide the input to each of the respective comparators.

4. The switch mode power supply of claim 3, further comprising a plurality of reference signals and a plurality of further combiners, the plurality of further combiners each being arranged to combine the respective reference signal with the filtered output, to provide a representation of the filtered output for the combiner which receives the output of each of the respective comparators and generates the inputs for the respective comparators.

5. The switch mode power supply of claim 4, wherein the plurality of reference signals are generated in dependence on the plurality of supply voltages in the power switch stage.

6. The switch mode power supply of claim 1, wherein the power switch stage receives the plurality of quantizer outputs, and in dependence thereon connects one of the plurality of supply voltages to the output of the switch mode power supply.

7. The switch mode power supply of claim 1, wherein the plurality of quantizer outputs is determined by the number of supply voltages in the power switch stage.

8. The switch mode power supply of claim 1 wherein the integrator comprises a loop filter.

9. An envelope tracking power supply comprising a switch mode power supply according to claim 1.

10. The switch mode power supply of claim 1, further comprising a combiner arranged to combine the filtered output and the reference signal, the combined output thereof providing the input to the quantizer.

11. The switch mode power supply of claim 10, further comprising a delay stage connected to receive the reference signal, wherein the combiner is arranged to combine the output of the delay stage with a feedback signal representing the output of the switch mode power supply.

12. The switch mode power supply of claim 1, further comprising a switching stage for receiving the plurality of quantizer outputs, and for connecting one of a plurality of signals representing the supply voltages to the subtractor.

13. An envelope tracking power supply including a switch mode power supply according to claim 1.

14. The switch mode power supply of claim 1, in which the quantizer is arranged to generate m quantizer outputs, and the power switch stage comprises m switching stages each arranged to connect one of n supply voltages to an output thereof in dependence on the quantizer outputs, and further comprising a combiner for combining the output of each switching stage to generate the output of the switch mode power supply.

15. A method for an asynchronous switch mode power supply, comprising:
    subtracting an output of the switch mode power supply from a reference signal;
    filtering the subtracted output;
    generating, by a quantizer, a plurality of quantizer outputs in dependence on the filtered subtracted output; and
    connecting one of a plurality of supply voltages to the output of the switch mode power supply in dependence on the quantizer outputs.

16. The method of claim 15, wherein the switch mode power supply further comprises a plurality of reference signals, an output switch stage, a plurality of comparators, and a plurality of further combiners, and wherein the method further comprises:
    combining, by the plurality of further combiners, the respective reference signal with the filtered output to provide a representation of the filtered output for the combiner which receives the output of each of the respective comparators and generates the inputs for the respective comparators; and
    generating the plurality of reference signals in dependence on the plurality of supply voltages in the output switch stage.

17. The method of claim 15, further comprising receiving, at an output switching stage of the switch mode power supply, the plurality of quantizer outputs, and in dependence thereon connecting one of the plurality of supply voltages to the output of the switch mode power supply.

18. A method in an envelope tracking power supply including a switch mode power supply according to claim 15.

19. The method of claim 15, in which a power switch stage of the switch mode power supply comprises a plurality of switcher stages, each switcher stage switching one of the plurality of supply voltages to an output of the switcher stage in dependence on the quantizer outputs, and further comprising combining the switcher stage outputs.

20. The method of claim 15, in which the quantizer generates m quantizer outputs, and a power switch stage of the switch mode power supply comprises m switching stages each connecting one of n supply voltages to an output thereof in dependence on the quantizer outputs, the method further comprising combining the output of each switching stage to generate the output of the switch mode power supply.

* * * * *